United States Patent
Lee et al.

(10) Patent No.: US 7,462,505 B2
(45) Date of Patent: Dec. 9, 2008

(54) GROWTH PROCESS OF A CRYSTALLINE GALLIUM NITRIDE BASED COMPOUND AND SEMICONDUCTOR DEVICE INCLUDING GALLIUM NITRIDE BASED COMPOUND

(75) Inventors: Chia Ming Lee, Yilan (TW); Tsung Liang Cheng, Nantou (TW); I Ling Chen, Yilan (TW); Yu Chuan Liu, Taoyuan (TW); Jen Inn Chyi, Taoyuan (TW)

(73) Assignee: Tekcore Co., Ltd., Nantou (TW)

( * ) Notice: Subject to any disclaimer, the term of this patent is extended or adjusted under 35 U.S.C. 154(b) by 67 days.

(21) Appl. No.: 11/063,479

(22) Filed: Feb. 23, 2005

(65) Prior Publication Data

US 2006/0189019 A1 Aug. 24, 2006

(51) Int. Cl.
*H01L 21/00* (2006.01)
(52) U.S. Cl. .......................................... 438/47; 438/46
(58) Field of Classification Search .................. 438/46, 438/47, 94, 172, 191, 312
See application file for complete search history.

(56) References Cited

U.S. PATENT DOCUMENTS

| | | | |
|---|---|---|---|
| 5,290,393 A | 3/1994 | Nakamura | |
| 5,686,738 A | 11/1997 | Moustakas | |
| 6,281,522 B1 * | 8/2001 | Ishibashi et al. | 257/77 |
| 2002/0030200 A1 * | 3/2002 | Yamaguchi et al. | 257/184 |
| 2002/0190259 A1 * | 12/2002 | Goetz et al. | 257/79 |
| 2006/0060873 A1 * | 3/2006 | Tu et al. | 257/97 |

* cited by examiner

*Primary Examiner*—Jack Chen
*Assistant Examiner*—Matthew L Reames
(74) *Attorney, Agent, or Firm*—Baker & McKenzie LLP

(57) ABSTRACT

In a method of forming a crystalline GaN-based material, a first nucleation layer is formed on a substrate at a first temperature, followed with forming a second nucleation layer at a second temperature different from the first temperature. The first and second nucleation layers are composed of $Al_xIn_yGa_{(1-x-y)}N$. Subsequently, a layer of a crystalline GaN-based compound is epitaxy grown on the second nucleation layer.

17 Claims, 2 Drawing Sheets

GROWTH PROCESS OF A CRYSTALLINE GALLIUM NITRIDE BASED COMPOUND AND SEMICONDUCTOR DEVICE INCLUDING GALLIUM NITRIDE BASED COMPOUND

FIELD OF THE INVENTION

The present invention generally relates to the manufacture of crystalline gallium nitride (GaN) based semiconductor devices, and more specifically to a process of forming a crystalline GaN-based compound and semiconductor devices including the same GaN-based compound.

DESCRIPTION OF THE RELATED ART

Electronic devices such as tight-emitting devices or transistor devices based on GaN semiconductor compounds have been subject to intensive researches and developments in the field of electronic industry. For a GaN-based transistor device, advantageous characteristics of the GaN-based semiconductor compound include high electron mobility and saturation velocity (about $2.5 \times 10^7$ cm/s), and high breakdown electric field (about $5 \times 10^6$ V/cm), which allow the GaN-based transistor device to work with a high current density. As a result, the GaN transistor device is particularly advantageous in high-power and high-temperature applications.

In light-emitting devices, a multilayer structure is usually formed from materials based on GaN-based compounds such as GaN, AlGaN, GaInN, and the like. The formed multi-layer structure includes a light-emitting layer sandwiched between an n-type cladding layer and a p-type cladding layer.

Regardless of whether it is a transistor or a light-emitting device implementation, the GaN-based compound is usually deposited in the form of an epitaxial layer over a substrate. In this deposition process, the crystalline quality of the epitaxial GaN-based layer determines the electron mobility and thus is a dominant factor to the performance of the semiconductor device. In this regard, many approaches are presently known in the art.

Conventionally, a vapor-phase epitaxy growth method is implemented to form a GaN-based layer on a substrate. However, the substrate material conventionally used either has a lattice structure that does not match with the crystalline structure of the GaN-based layer, or has a high density of dislocations. To solve this problem, a technique is known in the art consisting of depositing a buffer layer made of AlN or AlGaN at a low temperature of 900° C. or less on the substrate made of sapphire or the like, and then growing a GaN-based layer on the buffer layer. This technique is described in, for example, Japanese Patent Laid-Open No. 63-188938, the disclosure of which is incorporated herein by reference. The interposed buffer layer can reduce dislocations due to the lattice mismatch between the substrate and the GaN-based compound, and thereby improve the crystallinity and morphology of the GaN-based compound.

Another technique known in the art deposes a first GaN-based layer on the substrate and a protective film, such as silicon oxide or silicon nitride, to selectively cover areas of the GaN-based layer. A second GaN-based layer then is grown on the first GaN-based layer at areas uncovered by the protective film. The protective film prevents propagation of through-dislocations in the direction perpendicular to the interface of the substrate. This technique is described in, for example, Japanese Patent Laid-Open No. 10-312971, the disclosure of which is also incorporated herein by reference.

The aforementioned techniques may not provide satisfactory results in some aspects. In particular, the buffer layer formed between the GaN-based layer and the substrate may excessively absorb ultraviolet wavelength in light-emitting device implementations. Furthermore, the interposition of silicon nitride or silicon oxide may affect the electrical properties of the semiconductor devices.

Therefore, there is presently a need for a method of growing crystalline GaN-based materials that can compensate the lattice mismatch with the substrate and meanwhile exhibit improved characteristics such as reduced absorption of ultraviolet radiations.

SUMMARY OF THE INVENTION

The present application describes a process of forming a crystalline GaN-based compound and a semiconductor device including the GaN-based compound.

In an embodiment, a process of forming a crystalline GaN-based compound comprises forming a first nucleation layer on a substrate at a first processing temperature, forming a second nucleation layer on the first nucleation layer at a second processing temperature different from the first processing temperature, and forming an epitaxial GaN-based layer on the second nucleation layer.

In one embodiment, the first processing temperature is between about 1000° C. and 1200° C. In another embodiment, the second processing temperature is between about 400° C. and 1000° C. In some embodiments, the first nucleation layer is formed with a thickness between about 10Å and 100Å. In other embodiments, the second nucleation layer is formed with a thickness between about 300Å and 2000 Å.

In one embodiment, a GaN-based semiconductor device comprises a substrate, a crystalline GaN-based layer formed over the substrate, and at least two nucleation layers interposed between the substrate and the crystalline GaN-based layer. In some embodiments, the two nucleation layers are formed at different temperatures. In some variations, one of the two nucleation layers has a thickness between about 300Å and 2000Å, and the other nucleation layer is formed with a thickness between about 10Å and 100Å. In some variant embodiments, at least one of the two nucleation layers includes $Al_xIn_yGa_{(1-x-y)}N$, wherein x, y and (1-x-y) are within the range [0, 1].

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION OF THE EMBODIMENTS

The application describes a growth process of a crystalline GaN-based compound including at least three deposition steps. On a base substrate is formed a first nucleation layer at a first temperature, followed with forming a second nucleation layer at a second temperature different from the first temperature. The first and second nucleation layers include a compound expressed by the formula $Al_xIn_yGa_{(1-x-y)}N$. Subsequently, a layer of a crystalline GaN-based compound is epitaxy grown over the second nucleation layer.

"GaN-based compound or layer" is meant to include GaN, AlGaN, InGaN, AlInGaN and any combinations of Al, In and Ga with an N element. Suitable methods for forming the first and second nucleation layers and the GaN-based compound include a variety of vapor phase growth processes such as a metal-organic vapor phase epitaxy (MOVPE) growth deposition, a molecular beam epitaxy (MBE) growth deposition, a hydride vapor phase epitaxy (HVPE) growth deposition or the like.

Figure 1:
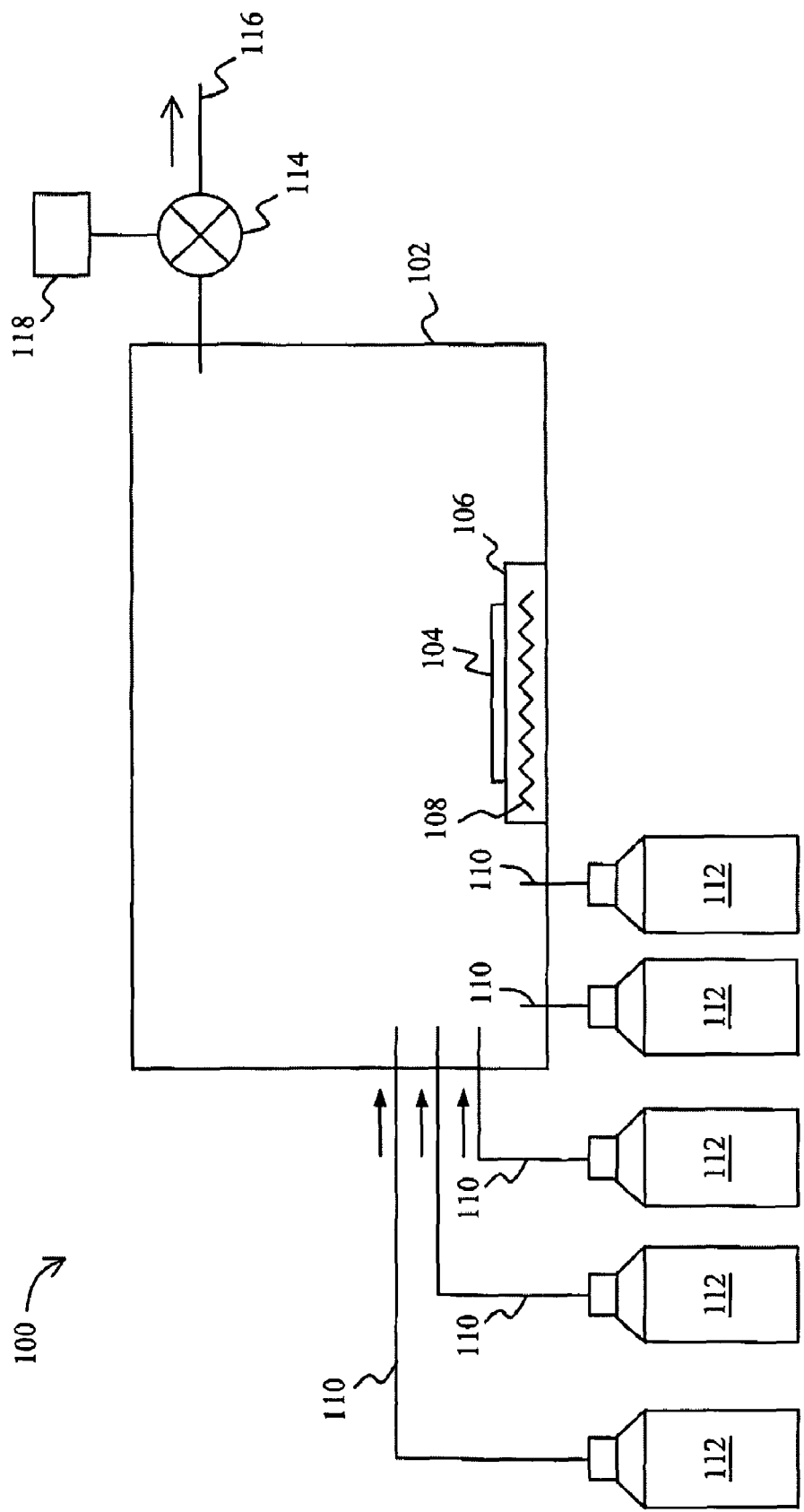
FIG. 1 is a schematic view of a MOVPE reactor implemented in a process of forming a crystalline GaN-based compound over a substrate according to an embodiment of the invention.

FIG. 1 is a schematic view of a MOVPE reactor implemented in a process of forming a crystalline GaN-based compound according to an embodiment of the invention. The reactor 100 includes a reacting chamber 102 in which a substrate 104 is placed on a susceptor 106 to undergo a deposition process. A heating device 108 is mounted to the susceptor 106 to heat the substrate 104. Gaseous chemicals are introduced into the reacting chamber 102 via inlet tubes 110 respectively connecting to the containers 112. A mechanical pump 114 is operable to discharge gases out of the reacting chamber 102 through an outlet tube 116. In addition, a control and regulating mechanism 118 connects to the mechanical pump 114 to regulate the pressure inside the reacting chamber 102.

FIGS. 2A~2D are schematic views of a process of forming a crystalline GaN-based compound according to an embodiment of the invention. In an embodiment, the crystalline GaN-based compound is a GaN layer formed over a sapphire base substrate, but a person skilled in the art will readily appreciate that the GaN layer can be formed on a base substrate made of different materials such as silicon substrate, silicon carbide (SiC) substrate or the like, or on a substrate including layers of different materials previously formed thereon.

Figure 2A:
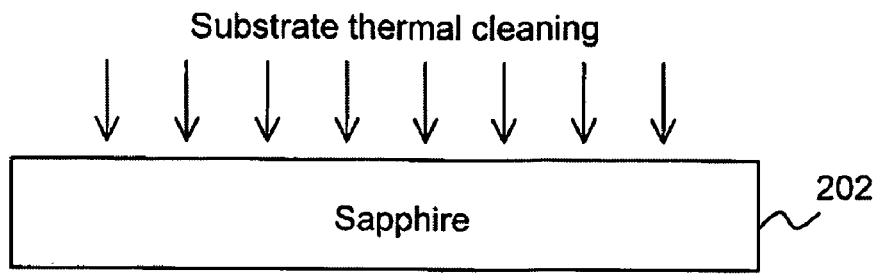
FIG. 2A is a drawing schematically showing an initial thermal cleaning process applied to the substrate according to an embodiment of the invention.

FIG. 2A is a schematic view showing an initial thermal cleaning process applied to the substrate according to an embodiment of the invention. The sapphire substrate 202 having a C-plane as the principal plane initially undergoes a thermal cleaning process. According to an embodiment, the thermal cleaning process includes heating the substrate 202 to a temperature above 1000° C. while introducing $H_2$ and/or $N_2$ at about 5 slm (standard liter per min) in a pressure environment kept at about 1000 mbar.

Figure 2B:
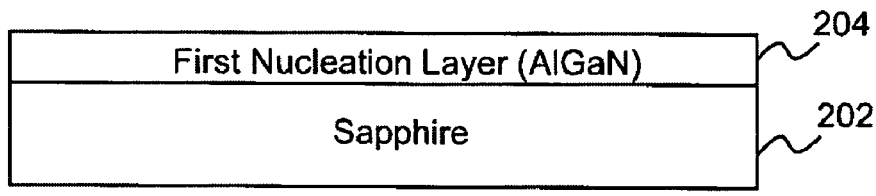
FIG. 2B is a schematic drawing illustrating the formation of a first nucleation layer on a substrate according to an embodiment of the invention.

FIG. 2B is a schematic view illustrating a MOVPE growth of a first nucleation layer 204 composed of $Al_xIn_yGa_{(1-x-y)}N$ on the substrate 202 according to an embodiment of the invention, where x, y and (1-x-y) are within the range [0, 1]. This embodiment exemplary implements a nucleation layer 204 made of AlGaN, i.e. x=1 and y=0; however, a skilled artisan will appreciate that the composition of the is nucleation layer may be suitably adjusted through the values of x and y. The cleaned substrate 202 is brought to a temperature between about 1000° C. and 1200° C. Ammonia gas ($NH_3$) then is fed at a flow rate of about 5000 sccm while trimethyl gallium (TMGa) and trimethyl aluminum (TMAl) are introduced at respective flow rates of about 2.5 sccm and 7.5 sccm into the reacting chamber kept at a pressure of about 110 mbar. A first nucleation layer 204 made of AlGaN thereby grows on the sapphire substrate 202. The first nucleation layer 204 is formed with a thickness between about 10Å and 100Å. A person skilled in the art will readily appreciate that suitable sources of Ga and Al can include alkyl metal compounds other than TMGa and TMAl, such as triethyl gallium (TEGa) and triethyl aluminum (TEAl) or the like.

Figure 2C:
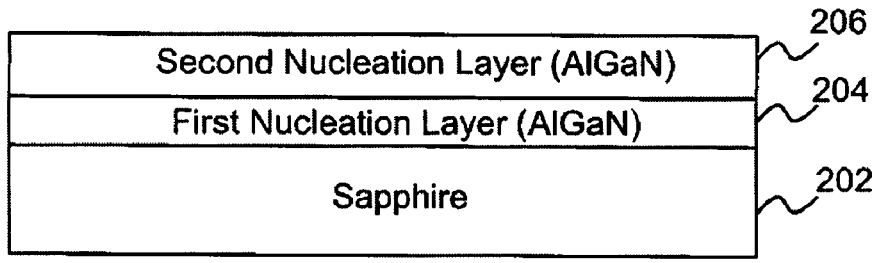
FIG. 2C is a schematic drawing illustrating the formation of a second nucleation layer on the first nucleation layer according to an embodiment of the invention.

FIG. 2C is a schematic view illustrating a MOVPE growth of a second nucleation layer 206 composed of $Al_xIn_yGa_{(1-x-y)}N$ on the first nucleation layer 204 according to an embodiment of the invention. In this embodiment, the second nucleation layer 206 also can be AlGaN. While the supply of $NH_3$ is maintained at 5000 sccm, the temperature of the substrate 202 is set between about 400° C. and 1000° C. TMGa and TMAl then are fed at respective flow rates of about 0.5 sccm and 37.5 sccm into the reacting chamber kept at a pressure of about 200 mbar. A second nucleation layer 206 made of AlGaN thereby grows on the first nucleation layer 204. The second nucleation layer 206 is formed with a thickness between about 300Å and 2000Å, and the range of Al composition is between about 0 and 1.

Figure 2D:
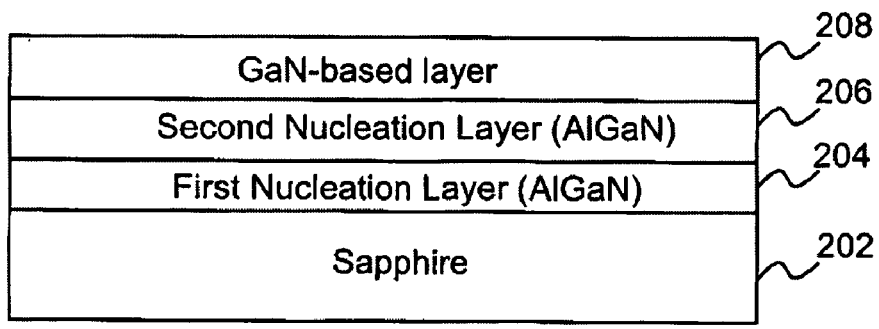
FIG. 2D is a schematic drawing illustrating the formation of a GaN-based layer on the second nucleation layer according to an embodiment of the invention.

FIG. 2D is a schematic view showing the epitaxy growth of a crystalline GaN-based compound layer 208 over the second nucleation layer 206 according to an embodiment of the invention. The GaN-based compound layer 208 can be composed of any combinations of Al, In and Ga with N elements, the epitaxy growth conditions of which depend on the particular characteristic requirements of the device to be formed.

In light-emitting device or GaN transistor implementations, the GaN-based layer 208 exemplary can be a doped GaN layer grown over the substrate. In a light-emitting device, the GaN layer can be configured as a first cladding layer on which a multi-quantum structure layer and a second cladding layer are stacked up, respectively. In a GaN transistor implementation, the GaN layer can be configured as an active region where electron and hole channeling occurs during the operation of the transistor semiconductor device.

The nucleation layers formed at different temperature can be grown at an economical cost and advantageously reduce the dislocations due to the lattice mismatch between the substrate and the epitaxial GaN-based compound. The lattice mismatch between the substrate and the epitaxial GaN-based compound can be compensated via the crystalline structure of the nucleation layers. Additionally, observations made in light-emitting device implementations show that the growth process forms a layer structure that can prevent adverse absorption of ultraviolet wavelengths, which advantageously increases the brightness of the light-emitting device. The reduction of the lattice mismatch and ultraviolet absorption can be adjusted through the composition of the nucleation layers (i.e. via adjusting the values x and y) according to the GaN-based layer to be formed.

Realizations in accordance with the present invention therefore have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the invention as defined in the claims that follow.

What is claimed is:

1. A process of forming a GaN-based layer, comprising:
   forming a first nucleation layer at a first processing temperature on a top surface of a base substrate made of sapphire, silicon or silicon carbide wherein the first nucleation layer is formed with a thickness between 10Å and 100Å;
   forming a second nucleation layer on a top surface of the first nucleation layer at a second processing temperature lower than the first processing temperature, wherein the second nucleation layer has a thickness between 300Å and 2000Å; and
   forming an epitaxial GaN-based layer on a top surface of the second nucleation layer;
   whereby the first and second nucleation layers are configured to compensate a lattice mismatch between the base substrate and the epitaxial GaN-based layer.

2. The process according to claim 1, wherein at least one of the first or second nucleation layer includes $Al_xIn_yGa_{(1-x-y)}N$, where x, y and (1-x-y) are within the range [0, 1].

3. The process according to claim 1, wherein the first processing temperature is between about 1000° C. and 1200° C.

4. The process according to claim 1, wherein the second processing temperature is between about 400° C. and 1000° C.

5. The process according to claim 1, wherein forming the first nucleation layer and the second nucleation layer includes performing a vapor-phase epitaxy growth process.

6. A process of forming a GaN-based layer, comprising:
   thermally cleaning a top surface of a base substrate;
   forming a plurality of nucleation layers on the cleaned top surface of the base substrate, wherein the nucleation layers include a first nucleation layer formed on the cleaned top surface of the base substrate at a first temperature and a second nucleation layer formed on a top surface of the first nucleation layer at a second temperature lower than the first temperature, wherein the first nucleation layer has a thickness between 10Å and 100Å, and the second nucleation layer has a thickness between 300Å and 2000Å;and
   forming an epitaxial GaN-based layer on a top of the nucleation layers;
   whereby the first and second nucleation layers are configured to compensate a lattice mismatch between the base substrate and the epitaxial GaN-based layer.

7. The process according to claim 6, wherein the nucleation layers include at least one nucleation layer comprised of $Al_xIn_yGa_{(1-x-y)}N$, wherein x, y and (1-x-y) are within the range [0, 1].

8. The process according to claim 6, wherein one or more nucleation layers are formed by a vapor-phase epitaxy deposition.

9. The process according to claim 6, wherein the first nucleation layer is formed at a temperature between about 1000° C. and 1200° C.

10. The process according to claim 6, wherein the second nucleation layer is formed at a temperature between about 400° C. and 1000°C.

11. A process of forming a GaN-based layer, comprising:
    forming a first nucleation layer at a first processing temperature on a top surface of a base substrate made of sapphire, silicon or silicon carbide;
    forming a second nucleation layer on a top surface of the first nucleation layer at a second processing temperature lower than the first processing temperature, wherein the second nucleation layer has a thickness between 300Å and 2000Å;and
    forming an epitaxial GaN-based layer on a top surface of the second nucleation layer;
    whereby the first and second nucleation layers are configured to compensate a lattice mismatch between the base substrate and the epitaxial GaN-based layer;
    wherein said process of forming a first nucleation layer is operated at a chamber pressure of about 110 mbar.

12. The process according to claim 11, wherein the first processing temperature is between about 1000° C. and 1200° C.

13. The process according to claim 11, wherein the second nucleation layer is formed at a temperature between about 400° C. and 1000° C.

14. The process according to claim 11, wherein said process of forming a second nucleation layer is operated at a chamber pressure of about 200 mbar.

15. The process according to claim 11, wherein the step of forming a first nucleation layer comprising feeding a NH3 gas at a flow rate of about 5000 sccm, a TMGa gas at a flow rate of about 2.5 sccm, and a TMAl gas at a flow rate of about 7.5 sccm.

16. The process according to claim 11, wherein the step of forming a second nucleation layer comprising feeding a NH3 gas at a flow rate of about 5000 sccm, a TMGa gas at a flow rate of about 0.5 sccm, and a TMAl gas at a flow rate of about 37.5 sccm.

17. The process according to claim 11, wherein the step of forming the first nucleation layer and the second nucleation layer includes performing a vapor-phase epitaxy growth process.

* * * * *